(12) United States Patent
Hong

(10) Patent No.: US 7,517,770 B2
(45) Date of Patent: Apr. 14, 2009

(54) METHOD FOR FORMING METAL LINE AND SEMICONDUCTOR DEVICE INCLUDING THE SAME

(75) Inventor: Chang Young Hong, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/550,569

(22) Filed: Oct. 18, 2006

(65) Prior Publication Data
US 2007/0093056 A1   Apr. 26, 2007

(30) Foreign Application Priority Data
Oct. 21, 2005   (KR) ...................... 10-2005-0099760

(51) Int. Cl.
*H01L 21/20* (2006.01)
(52) U.S. Cl. ................................ 438/382; 257/E21.004
(58) Field of Classification Search ................. 438/722, 438/382; 257/E21.004
See application file for complete search history.

(56) References Cited

U.S. PATENT DOCUMENTS

2002/0115299 A1* 8/2002 Ito et al. ..................... 438/704
2003/0045131 A1* 3/2003 Verbeke et al. .............. 438/795
2005/0029665 A1* 2/2005 Lin et al. ..................... 257/762
2006/0118892 A1* 6/2006 Wu et al. ..................... 257/412

FOREIGN PATENT DOCUMENTS

TW   402858   8/2000

OTHER PUBLICATIONS

Search Report dated Jan. 12, 2007.

* cited by examiner

*Primary Examiner*—Asok K Sarkar
(74) *Attorney, Agent, or Firm*—Sherr & Vaughn, PLLC

(57) ABSTRACT

Disclosed is a technique of manufacturing a semiconductor device and a corresponding device. A metal line may be formed in a semiconductor device using a photoresist pattern with an oxide layer formed on the surface of a metal film, in accordance with embodiments. A heat-treatment process on a metal film may be performed to form an oxide-based thin film on a surface of the metal film. A photoresist pattern may be formed over a metal film. A metal film may be etched using a photoresist pattern as a mask. In embodiments, heat-treatment of a metal film may be performed in-situ using a baking unit provided in a track device that performs photo processing. Etching a metal film and etching an oxide-based thin film may be performed simultaneously.

19 Claims, 6 Drawing Sheets

METHOD FOR FORMING METAL LINE AND SEMICONDUCTOR DEVICE INCLUDING THE SAME

The present application claims priority under 35 U.S.C. 119 and 35 U.S.C. 365 to Korean Application No. 10-2005-0099760 (filed on Oct. 21, 2005), which is hereby incorporated by reference in its entirety.

BACKGROUND

In semiconductor manufacturing technology, photo processing may be used to accomplish relatively high integration of semiconductor devices. During photo processing, a photoresist pattern may be formed on a substrate using light. Photo processing may be performed in different ways using a photoresist film. The method of photo processing may depend on the types of substrates, the degree of adhesiveness between a substrate and a photoresist film, and/or the reflectivity of an exposure wavelength on a substrate. Photoresist film may comprise an organic compound. If a substrate includes a metal film, unpredictable horizontal and vertical defects may be caused in sidewalls of a photoresist film due to diffused reflection and high reflection from the metal film when the photoresist film is developed. To reduce this effect, a photoresist film may be formed along with an anti-reflective coating.

A metal line may be formed using a metal film. A metal film may include at least one of Aluminum (Al), Titanium Nitride (TiN), and Titanium (Ti). A metal film may be formed on a substrate through a thin film process. A photoresist for anti-reflection may be coated through a photo process along with an anti-reflective coating. An anti-reflective coating may be used to minimize light reflected from interfacial surfaces having different reflective indexes. An anti-reflective coating may include a polymer layer having a desired reflective index and/or a high absorption coefficient for an exposure wavelength that may process a photoresist and the anti-reflective coating.

FIG. 1 illustrates a photoresist pattern 40a over metal film 20. In part (a) of FIG. 1, there is no anti-reflective coating between photoresist pattern 40a and metal film 20. In part (b) of FIG. 1, anti-reflective coating 30 is between photoresist pattern 40a and metal film 20. Photoresist pattern 40a may be formed after forming anti-reflective coating 30. As illustrated in the lower part of FIG. 1, photoresist pattern 40a may be formed with less distortion when anti-reflective coating 30 is used (e.g. see comparison of part (a) and part (b)).

Photoresist pattern 40a may be formed by coating photoresist material over metal film 20. Photoresist material may be coated over the entire surface of metal film 20 by rotating a substrate at a high speed. A solvent of a photoresist material may be vaporized and removed through a baking process at a predetermined temperature, thereby hardening the photoresist material. An exposure process may be performed using mask 50 as a stepper. In this exposure process, rays of ultraviolet light 60 may be projected onto the photoresist material through photo mask 50 to form photoresist pattern 40a from the photoresist material. From the attributes of mask 50, a micro circuit pattern may be formed associated with the pattern of photoresist pattern 40a. A micro circuit pattern may be a metal line pattern of a semiconductor device. Metal film 20 may be etched using photoresist pattern 40a as a mask. A process of etching metal film 20 may include separate steps of etching anti-reflective coating 30 and etching metal film 20 to form metal lines.

As illustrated in FIG. 2, polymer-based particles 30b may be incidentally deposited on the anti-reflective coating 30, when anti-reflective coating 30 is etched. Polymer-based particles 30b may drop to metal film 20 during processing, as illustrated in FIG. 3. Existence of polymer-based particles 30b may reduce a yield rate of semiconductor device manufacturing.

As illustrated in FIG. 4, if a metal line is formed using only photoresist pattern 40a (without forming an anti-reflective coating), footings 40b may result on photoresist pattern 40a. Footings 40b may be caused by NH3 or NH4+ existing on the surface of metal film 20. Along with reflection complications caused by the absence of an anti-reflective coating, footings 40b may prevent a metal line pattern from being etched.

SUMMARY

Embodiments relate to a technique of manufacturing a semiconductor device. A metal line may be formed in a semiconductor device using a photoresist pattern with an oxide layer formed on the surface of a metal film, in accordance with embodiments. A heat-treatment process on a metal film may be performed to form an oxide-based thin film on a surface of the metal film. A photoresist pattern may be formed over a metal film. A metal film may be etched using a photoresist pattern as a mask. In embodiments, heat-treatment of a metal film may be performed in-situ using a baking unit provided in a track device that performs photo processing. In embodiments, etching a metal film and etching an oxide-based thin film may be performed simultaneously.

BRIEF DESCRIPTION OF DRAWINGS

Example

Example

DETAILED DESCRIPTION

Figure 1:
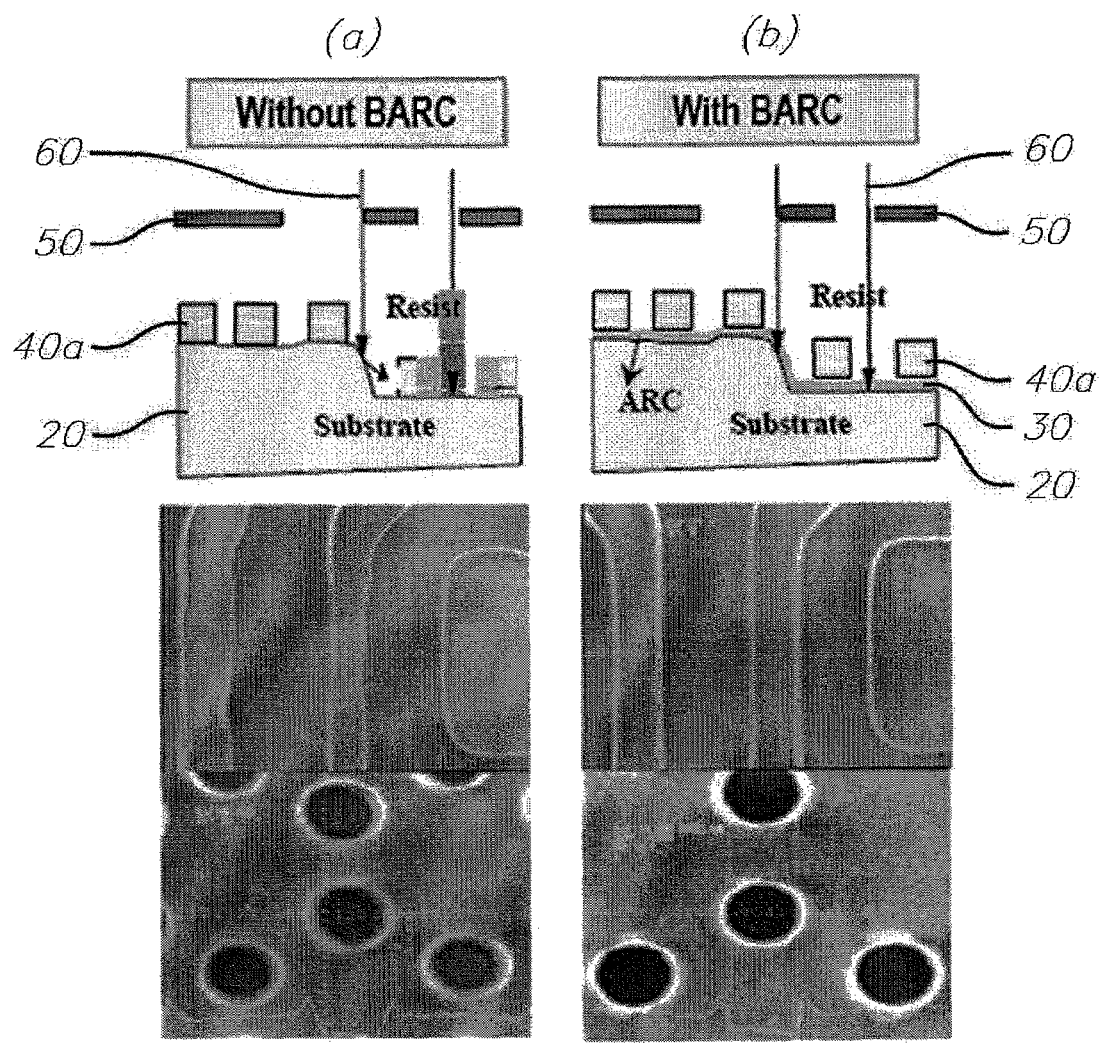
FIG. 1 illustrates sectional views of a photoresist pattern with and without anti-reflective coatings.
Figure 2:
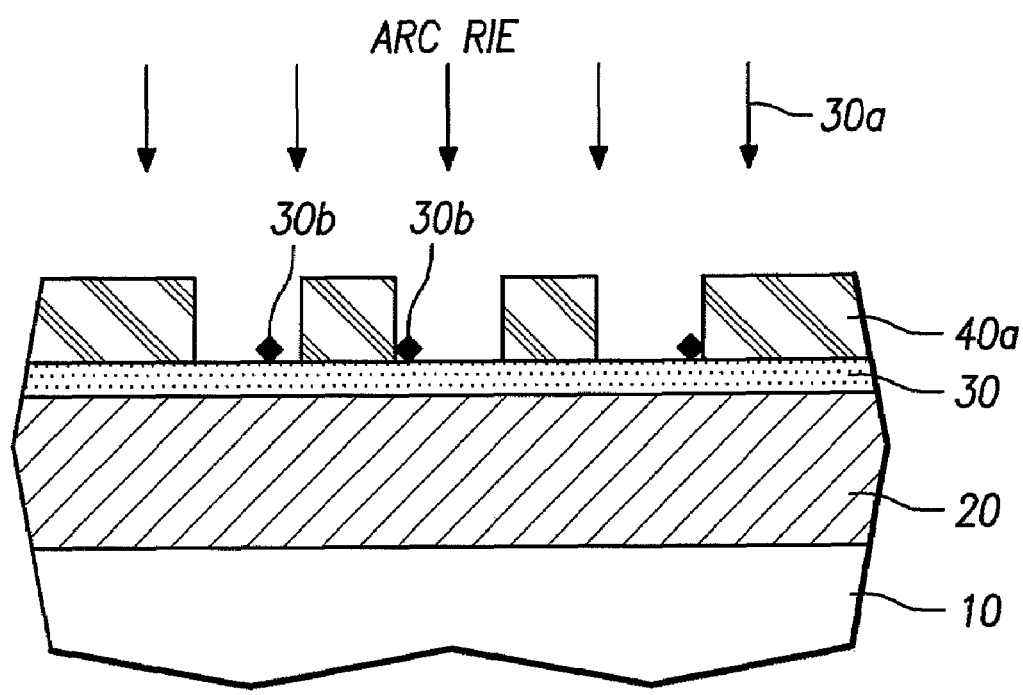
FIG. 2 is a sectional view illustrating the formation of a metal line.
Figure 3:
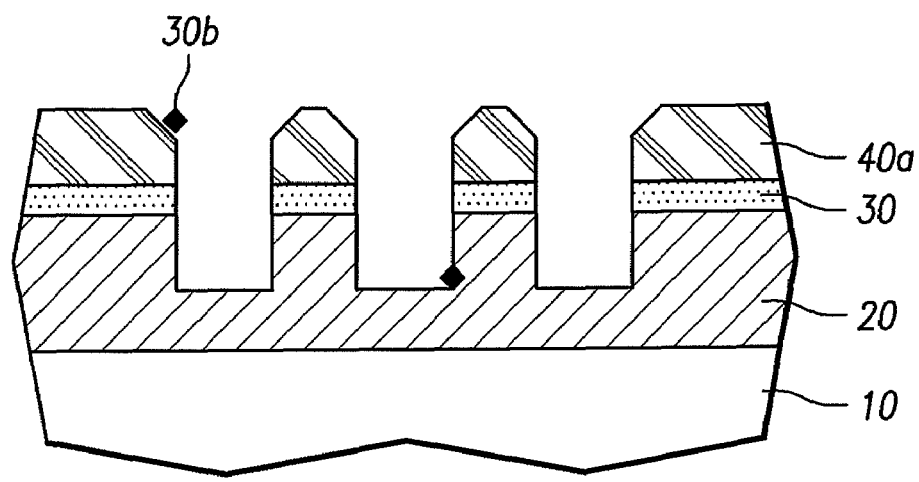
FIG. 3 is a sectional view illustrating the formation of polymer-based particles.
Figure 4:
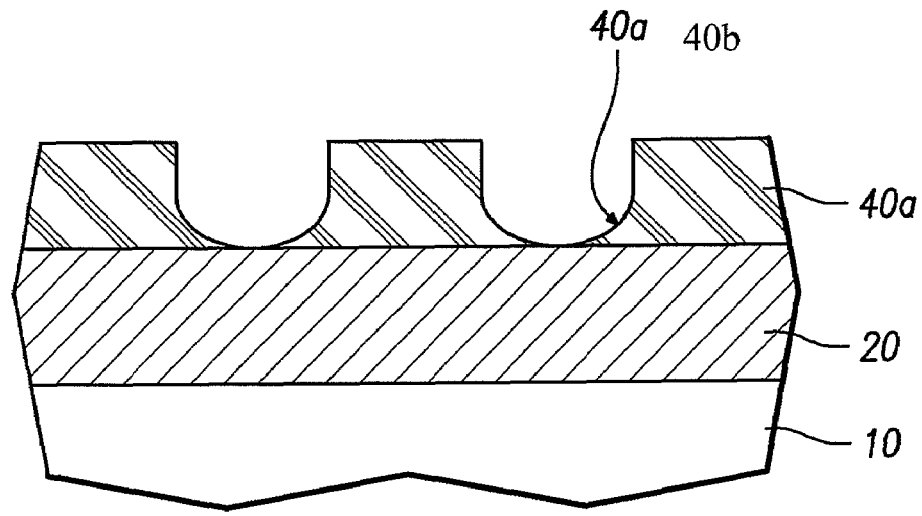
FIG. 4 is a sectional view illustrating footings.
Figure 5A:
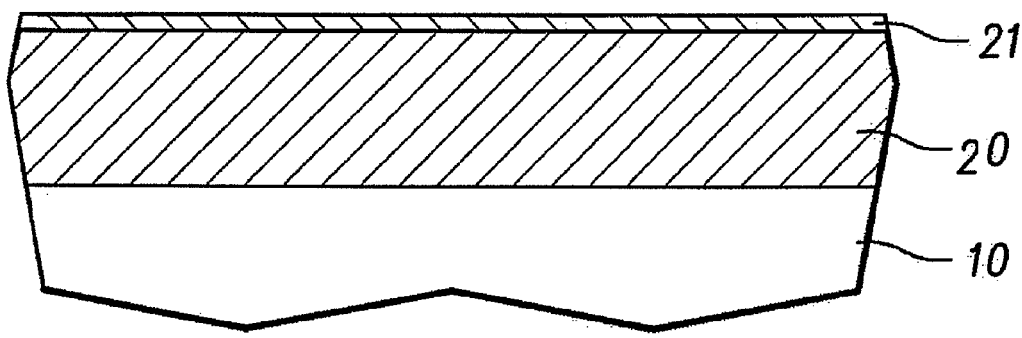
FIGS. 5A to 5C are sectional views illustrating a method of forming a metal line, in accordance with embodiments.
Figure 5B:
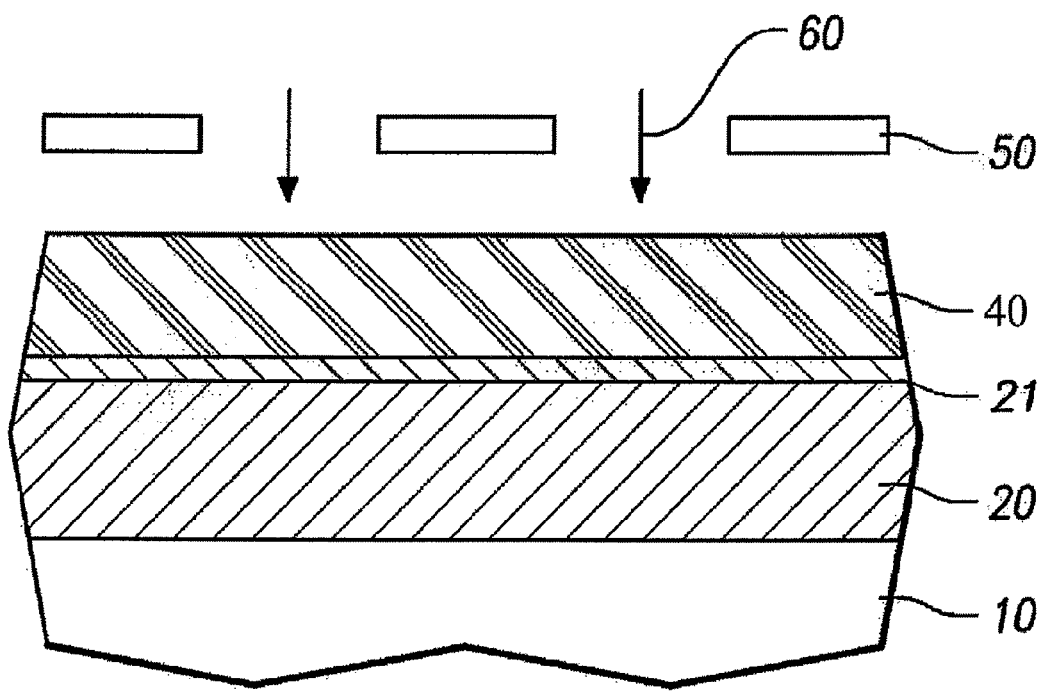
Figure 5C:
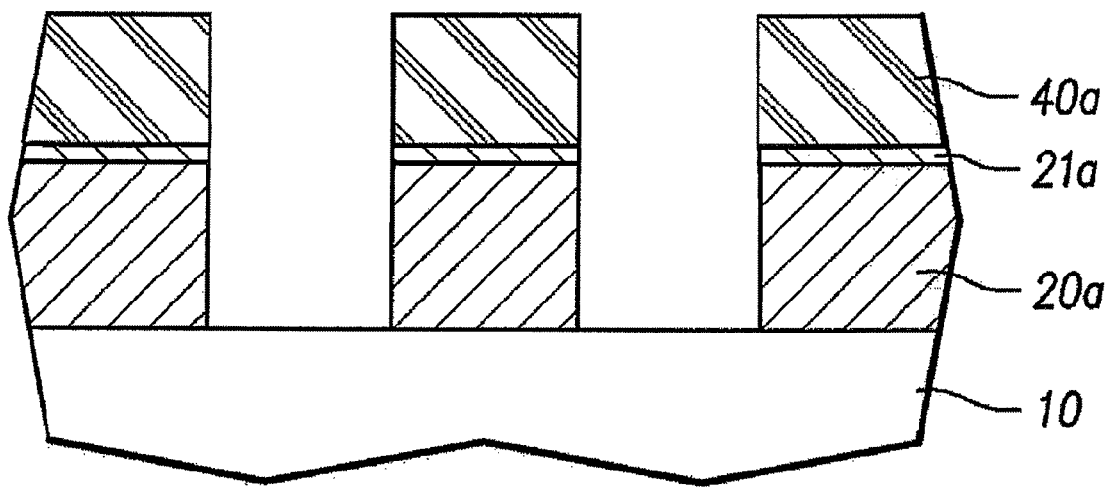

Example FIGS. 5A to 5C are sectional views illustrating a method of forming a photoresist pattern, in accordance with embodiments. As illustrated in FIG. 5A, metal film 20 may be formed over semiconductor substrate 10. The metal film 20 may include at least one of Aluminum (Al), Titanium Nitride (TiN), and Titanium (Ti).

A heat-treatment process may be performed on metal film 20 to form oxide-based thin film 21 on metal film 20, in accordance with embodiments. A heat-treatment process may be performed in-situ using a baking unit. A baking unit may be installed in a track device configured to perform photo processing. During a heat-treatment process, metal film 20 may be exposed to heat with a temperature range of 350° C. to 400° C. for 50 seconds to 70 seconds. However, one of ordinary skill in the art would appreciate other temperature ranges and treatment durations. Oxide-based thin film 21 may be formed on the surface of metal film 20. Oxide-based thin film 21 formed on the surface of metal film 20 may substantially eliminate NH3 and NH4+ existing on the surface of metal film 20. Substantial elimination of NH3 and NH4+ may substantially prevent the formation of footings when a photoresist pattern is formed.

As illustrated in FIG. 5B, photoresist 40 may be formed over metal film 20 and oxide-based thin film 21, in accordance with embodiments. Photoresist material may be deposited over metal film 20 and oxide-based thin film 21. Photoresist 40 may be formed from photoresist material as a uniform thin film by rotating substrate 10 at a high speed. A soft baking process may be performed to heat substrate 10. A soft baking process may be performed at a temperature range between about 90° C. and about 120° C. However, one of ordinary skill in the art would appreciate other temperature ranges. As heat is applied to photoresist 40, solvent may be evaporated so that photoresist 40 is dried. Drying of photoresist 40 may result in an improved degree of adhesiveness and reduced stress of photoresist 40.

Light 60 may be projected onto photoresist 40 through mask 50 in an exposure process, in accordance with embodiments. Mask 50 may act as a stepper. A baking process may be performed. A baking process may be performed after an exposure process at a temperature range between about 90° C. and about 120° C. One of ordinary skill in the art would appreciate other ranges. Through a baking process, an improved wave profile may result at a boundary area between an exposed part and a non-exposed part of photoresist 40. In embodiments, since oxide-based thin film 21 is formed on metal film 20, diffused reflection of light from metal film 20 may be substantially prevented.

As illustrated in FIG. 5C, a development process may be performed to form photoresist pattern 40a. In a development process, sections of photoresist film 40 (e.g. sections having a relatively weak bonding force as a result of an exposure process) may be melted and removed by a developing solution. A hard baking process may be performed with respect to the resultant structure. A hard baking process may be performed between a temperature of about 100° C. and about 140° C. One of ordinary skill in the art would appreciate other temperature ranges. Photoresist pattern 40a may be dried and hardened with an increased degree of adhesiveness.

Metal film 20 may be etched using photoresist pattern 40a as a mask to form metal line 20a. In embodiments, oxide-based thin film 21 on the surface of metal film 20 and metal film 20 may be simultaneously etched to form metal line 20a and oxide-based thin film pattern 21 a. Since there is no anti-reflective coating between photoresist pattern 40a and metal film 20, there is no need for a separate etching process to etch an anti-reflective coating. Without having to etch an anti-reflective coating, formation of polymer-type particles may be substantially prevented, which may improve the yield of semiconductor device manufacturing.

Figure 6:
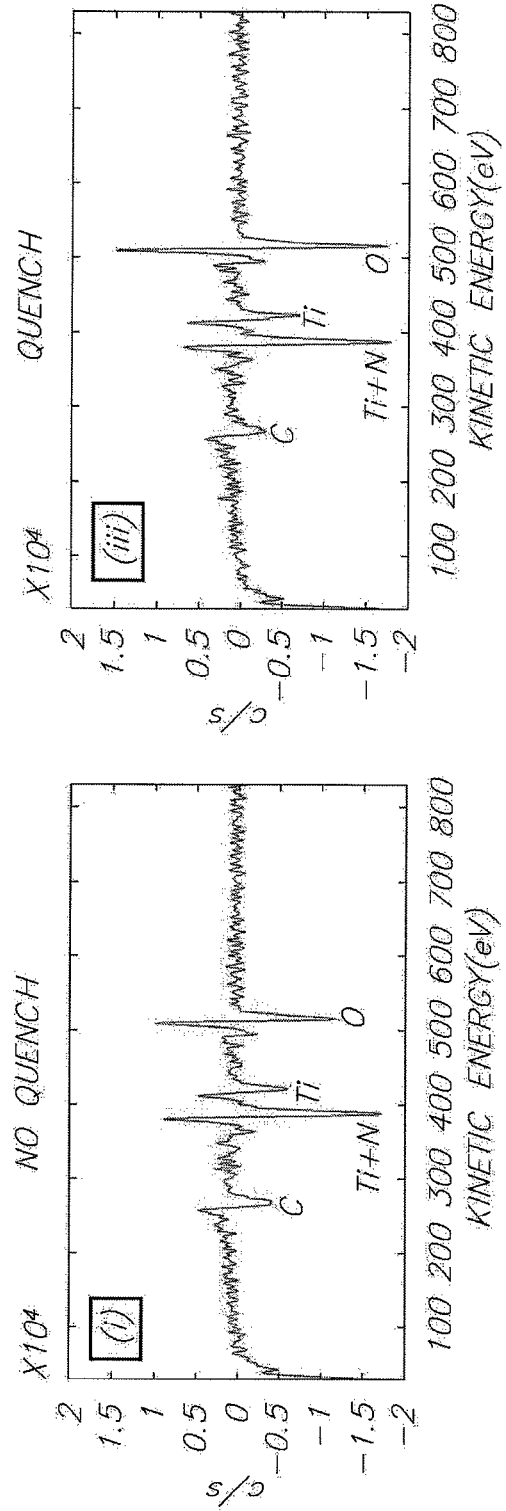
FIG. 6 illustrates graphs showing auger data obtained by analyzing the thickness difference between oxide films formed on the surface of a metal film according to a heat treatment process of the metal film, in accordance with embodiments.
Figure 6:
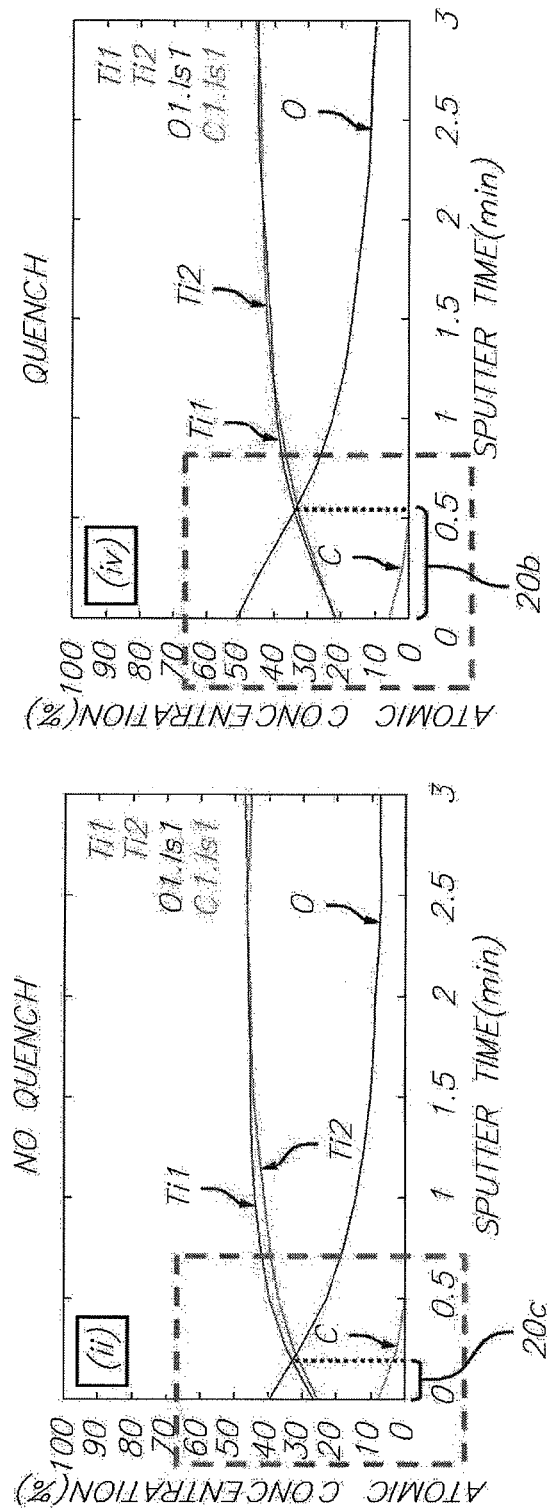

Example FIG. 6 illustrates graphs of auger data obtained by analyzing thickness differences between oxide films formed on a surface of a metal film, according to a heat treatment process on the metal film, in accordance with embodiments. In embodiments, a metal film may be formed by stacking Aluminum (Al), Titanium nitride (TiN), and Titanium (Ti). FIGS. 6(i) and 6(ii) illustrate example characteristic of a surface state of a metal film before a heat treatment process on the metal film, in accordance with embodiments. FIGS. 6(iii) and 6(iv) illustrate example characteristics of the surface state of a metal film after a heat treatment process is performed on the metal film, in accordance with embodiments. As illustrated in a comparison of FIGS. 6(ii) and 6(iv) shown in FIG. 6, sputter time 20b of a metal film with an oxide-based thin film is more than twice than sputter time 20c of a metal film without an oxide based thin film, in accordance with embodiments. In embodiments, an oxide based thin film is formed on a metal film of Titanium.

In embodiments, a heat-treatment process is performed on a metal film to form an oxide-based thin film on the metal film, which may substantially prevent formation of footing in a photoresist pattern. In embodiments, footings may be prevented due to the absence of complications resulting from an anti-reflective coating. In embodiments, since an anti-reflective coating is not formed, etching of a metal film may be performed without having to separately etch an anti-reflective coating, which may reduce processing costs. In embodiments, since an oxide-based thin film is formed on the surface of a metal film in place of an anti-reflective coating, polymer-based particles may be prevented from being deposited, which may improve a yield rate of semiconductor device manufacturing.

It will be obvious and apparent to those skilled in the art that various modifications and variations can be made in the embodiments disclosed. Thus, it is intended that the disclosed embodiments covers the obvious and apparent modifications and variations, provided that they are within the scope of the appended claims and their equivalents.

What is claimed is:

1. A method comprising:
   forming a metal film over a semiconductor substrate;
   performing a first heat-treatment process on the metal film to form an oxide-based thin film on a surface of the metal film and also remove components of $NH_3$ and $NH_4+$ from the surface of the metal film, wherein the first heat-treatment process is performed in-situ using a bake unit comprised in a track device configured to perform photo processing;
   forming a photoresist film on and contacting the oxide-based thin film including performing a second heat-treatment process on the photoresist film;
   exposing the photoresist film to light;
   forming a photoresist pattern on and contacting the oxide-based thin film; and
   etching the metal film using the photoresist pattern as a mask, wherein said etching the metal film comprises etching the oxide-based thin film and the metal film simultaneously.

2. The method of claim 1, wherein the first heat-treatment process is performed at a temperature between about 350° C. and about 400° C. for a time period of about 50 seconds to about 70 seconds.

3. A method comprising:
   forming a metal film on a semiconductor substrate; and then
   removing components of $NH_3$ and $NH_4+$ from the surface of the metal film by exposing the metal film to a first heat-treatment process to form an oxide-based film on the metal film; and then
   forming a photoresist film on and contacting the oxide-based film including performing a second heat treatment process on the photoresist film; and then
   performing a third heat treatment process on the photoresist film; and then
   forming a photoresist pattern by performing a development process on the photoresist film to also expose a portion of the oxide-based film; and then
   performing a fourth heat treatment process on the photoresist pattern; and then forming a oxide-based film pattern and a metal film pattern by simultaneously etching the oxide-based film and the metal film.

4. The method of claim 3, further comprising, after forming the photoresist film and before performing the third heat treatment process, exposing the photoresist film to light.

5. The method of claim 4, wherein the third heat-treatment process is performed at a third predetermined temperature.

6. The method of claim 5, wherein the third predetermined temperature is between about 90° C. and about 120° C.

7. The method of claim 4, wherein the fourth heat-treatment process is performed at a fourth predetermined temperature.

8. The method of claim 7, wherein the fourth predetermined temperature is between about 100° C. and about 140° C.

9. The method of claim 4, wherein the first heat-treatment process is performed at a first predetermined temperature.

10. The method of claim 9, wherein the first predetermined temperature is between about 350° C. and about 400° C.

11. The method of claim 4, wherein the second heat-treatment process is performed at a second predetermined temperature.

12. The method of claim 11, wherein the second predetermined temperature is between about 90° C. and about 120° C.

13. A method comprising:

sequentially forming a first metal film, a second metal film and a third metal film on a semiconductor substrate; and then removing components of $NH_3$ and $NH_4+$ from the surface of the third metal film by performing a first heat-treatment process to thereby form an oxide-based film on the third metal film; and then forming a photoresist film on and contacting the oxide-based film, wherein forming the photoresist film includes performing a second heat treatment process; and then exposing the photoresist film to light; and then performing a third heat treatment process on the photoresist after exposing the photoresist to light; and then forming a photoresist pattern by performing a development process on the photoresist film to also expose a portion of the oxide-based film; and then forming a oxide-based film pattern, a first metal film pattern, a second metal film pattern and a third metal film pattern by simultaneously etching the oxide-based film, the first metal film, the second metal film and the third metal film.

14. The method of claim 13, wherein the first metal film comprises aluminum, the second metal film comprises titanium nitride and a third metal film comprises titanium.

15. The method of claim 14, further comprising, after forming the photoresist pattern and before performing the oxide-based film pattern, performing a fourth heat treatment process on the photoresist pattern.

16. The method of claim 15, wherein the fourth heat-treatment process is performed at a temperature between about 100° C. and about 140° C.

17. The method of claim 16, wherein the first heat-treatment process is performed at a temperature between about 350° C. and about 400° C.

18. The method of claim 17, wherein the second heat-treatment process is performed at a temperature between about 90° C. and about 120° C.

19. The method of claim 18, wherein the third heat-treatment process is performed at a temperature between about 90° C. and about 120° C.

* * * * *